United States Patent [19]

Ando

[11] Patent Number: 5,138,408

[45] Date of Patent: Aug. 11, 1992

[54] RESONANT TUNNELING HOT CARRIER TRANSISTOR

[75] Inventor: Yuji Ando, Tokyo, Japan

[73] Assignee: NEC Corporation, Tokyo, Japan

[21] Appl. No.: 683,521

[22] Filed: Apr. 9, 1991

Related U.S. Application Data

[63] Continuation of Ser. No. 337,823, Apr. 14, 1989, abandoned.

[30] Foreign Application Priority Data

Apr. 15, 1988 [JP] Japan .................. 63-93042

[51] Int. Cl.$^5$ .................. H01L 29/80; H01L 27/12; H01L 29/72
[52] U.S. Cl. ......................... 357/22; 357/4; 357/34; 357/36
[58] Field of Search .................. 357/4, 46, 36, 34, 16, 357/17, 30, 22; 372/43, 45

[56] References Cited

U.S. PATENT DOCUMENTS

| | | | |
|---|---|---|---|
| 3,489,963 | 1/1970 | Gillet | 357/46 |
| 3,626,257 | 12/1971 | Esaki et al. . | |
| 4,439,782 | 3/1984 | Holonyak, Jr. . | |
| 4,450,463 | 5/1984 | Chin . | |
| 4,581,621 | 4/1986 | Reed | 357/16 |
| 4,635,343 | 1/1987 | Kuroda . | |
| 4,645,707 | 2/1987 | Davies | 357/4 |
| 4,688,068 | 8/1987 | Chaffin et al. . | |
| 4,712,121 | 12/1987 | Yokoyama | 357/4 |
| 4,745,452 | 5/1988 | Sollner | 357/16 |
| 4,792,832 | 12/1988 | Baba et al. . | |
| 4,799,091 | 1/1989 | Reed | 357/16 |
| 4,821,090 | 4/1989 | Yokoyama . | |
| 4,825,264 | 4/1989 | Inata et al. | 357/4 |
| 4,845,541 | 7/1989 | Xu et al. | 357/34 |
| 4,849,934 | 7/1989 | Yokoyama et al. | 365/159 |
| 4,873,558 | 10/1989 | Antreasyan et al. . | |
| 4,912,531 | 3/1990 | Reed et al. | 357/16 |

FOREIGN PATENT DOCUMENTS 61-296765  12/1986  Japan .
62-130561   6/1987  Japan .
62-152165   7/1987  Japan .
62-205658   9/1987  Japan .
62-216361   9/1987  Japan .

OTHER PUBLICATIONS

Three-Dimensional Integration of Resonant Tunneling Structures for Signal Processing & Three State Logic, Appl. Phys. Letter, 52(25), Jun. 20, 1988, Robert E. Potter et al.

Lakhani et al., "Combining Resonant Tunneling Diodes for Signal Processing and Multilevel Logic", *Applied Physics Lett.*, 52(20), May 16, 1988, pp. 1684–1685.

Yoo et al., "Influence of Spacer Layer Thickness on the Current-Voltage Characteristics of AlGaAs/GaAs and AlGaAs/InGaAs Resonant Tunneling Diodes", *Applied Physics Lett.*, 56(1), Jan. 1, 1990, pp. 84–86.

Capasso et al., "Multiple Negative Transconductance and Differential Conductance in a Biopolar Transistor (List continued on next page.)

Primary Examiner—Andrew J. James
Assistant Examiner—Carl Whitehead, Jr.
Attorney, Agent, or Firm—Burns, Doane, Swecker & Mathis

[57] ABSTRACT

A resonant tunneling hot carrier transistor according to the present invention is provided with a first multiple-layer structure provided on a substrate and having a first collector layer, a first collector barrier layer, a first base layer and a first quantum well resonator, a common emitter layer, and a second multiple-layer structure provided on the common emitter layer and having a second quantum well resonator, a second base layer, a second collector barrier layer and a second collector layer. The first and second quantum well resonators respectively provide first and second sub-bands different in energy level, so that carrier injections take place from the first and second quantum well resonators into the first and second base layers at different emitter-base voltage levels, respectively.

12 Claims, 7 Drawing Sheets

OTHER PUBLICATIONS by Sequential Quenching of Resonant Tunneling", *Applied Physics Lett.*, 53(12), Sep. 19, 1988, pp. 1056–1058.

Sen et al., "New Resonant-Tunneling Devices with Multiple Negative Resistance Regions and High Room-Temperature Peak-to-Valley Ratio", *IEEE Electron Dev. Letters*, vol. 9, No. 8, Aug. 1988, pp. 402–404.

Tsuchiya et al., "Dependence of Resonant Tunneling Current on Well Widths in AlAs/GaAs/AlAs Double Barrier Diode Structures", *Applied Physics Lett.*, 49(2), Jul. 14, 1986, pp. 88–90.

Tsuchiya et al., "Dependence of Resonant Tunneling Current on Al Mole Fractions in $Al_xGa_{1-x}As$-GaAs-$Al_xGa_{1-x}As$ Double Barrier Structures", *Applied Physics Lett.*, 50(21), May 25, 1987, pp. 1503–1505.

Capasso et al., "Resonant Tunneling Gate Field-Effect Transistor", 2 pages, 1986.

"(Invited) MBE-Grown GaAs/N-AlGaAs Herterostructures and Their Application to High Electron Mobility Transistors", Hiyamizu et al., *Japanese Journal of Applied Physics*, vol. 21, (1982), Suppl. 21-1, pp. 161–168.

"Low Noise Normally On and Normally Off Two-Dimensional Electron Gas Field-Effect Transistors", Laviron et al., *Applied Physics Letters*, 40(6), Mar. 15, 1982, pp. 530–532.

"A New $Al_{0.3}Ga_{0.7}As$/GaAs Modulation-Doped FET", Kopp et al., IEEE Electron Device Letters, vol. EDL, No. 3, No. 5, May 1982, pp. 109–111.

"A Resonant-Tunneling Bipolar Transistor (RBT)—A New Functional Device with High Current Gain", Futatsugi et al., *Japanese Journal of Applied Physics*, vol. 26, No. 2, Feb. 1987, pp. L131 to L133.

"A New Functional, Resonant-Tunneling Hot Electron Transistor (RHET)", Yokoyama et al., *Japanese Journal of Applied Physics*, vol. 24, No. 11, Nov. 1985.

RESONANT TUNNELING HOT CARRIER TRANSISTOR

This application is a continuation of application Ser. No. 07/337,823, filed Apr. 14, 1989 now abandoned.

FIELD OF THE INVENTION

This invention relates to a semiconductor device and, more particularly, to a resonant tunneling hot carrier transistor capable of producing complementary two output signal.

BACKGROUND OF THE INVENTION

Research and development efforts are made for the applications of the resonant tunneling phenomenon to high-speed semiconductor devices as well as new functional devices. Since each electron merely consumes an extremely short transit time period for traveling over the base layer by the agency of the resonant tunneling phenomenon, an extremely high switching speed can be achieved by the resonant tunneling bipolar device. Another attractive point of the resonant tunneling bipolar device resides in the fact that a negative differential resistance region takes place in the base-emitter current-to-voltage characteristics, and the negative differential resistance is conducive to the high speed switching operation as well as providing a potentiality for a new function to the semiconductor device.

A typical example of the resonant tunneling hot electron transistor is disclosed by Yokoyama et al in "A New Functional, Resonant-Tunneling Hot Electron Transistor (RHET)", Japanese Journal of Applied Physics, Vol. 24, No. 11, November, 1985, pages L853 to L854. Yokoyama et al propose the structure a half of which is shown in FIG. 1, and the energy band diagram shown in FIG. 2 takes place in the structure under an appropriate biasing state. For better understanding of the Applicant's invention, description is hereinunder made for the structure of a typical example of the resonant tunneling hot electron transistor the structure and the behavior thereof.

Referring first to FIG. 1 of the drawings, the resonant tunneling hot electron transistor is fabricated on a semi-insulating substrate 1 of gallium arsenide. On the gallium arsenide semi-insulating substrate 1 are successively grown an n-type gallium arsenide collector layer 2, a non-dope aluminum-gallium-arsenide potential barrier layer 3, an n-type gallium arsenide base layer 4, a non-doped aluminum gallium arsenide potential barrier layer 5, a non-doped gallium arsenide quantum well layer 6, a non-doped aluminum gallium arsenide potential barrier layer 7, and an n-type gallium arsenide emitter layer 8 which form in combination a multiple-layer structure partially cut away to expose the collector layer 2 and the base layer 4. A collector electrode 9 and a base electrode 10 are provided on the exposed surfaces of the base and collector layers 2 and 4, respectively, and the emitter electrode 11 is formed on the emitter layer 8. The non-doped aluminum gallium arsenide quantum well layer 6 and the non-doped aluminum gallium arsenide potential barrier layers 5 and 7 as a whole constitute a super-lattice film structure 12 for a quantum well resonator.

In the structure shown in FIG. 1, an energyband takes place in a biasing state as shown in FIG. 2. With an appropriate voltage level applied between the base electrode 10 and the emitter electrode 11, the quantum well resonator injects electrons into the n-type gallium arsenide base layer 4 due to the resonant tunneling phenomenon, and each of the electrons injected into the base layer 4 becomes a hot electron HE traveling over the n-type gallium arsenide base layer 4 at an extremely high speed before reaching the n-type gallium arsenide collector layer 2. A negative differential resistance region is achieved in the base-emitter current-to-voltage characteristics due to the resonant tunneling phenomenon, and each of the hot electrons merely consumes an extremely small amount of time period, so that the resonant tunneling hot electron transistor is an attractive candidate for the component element of an high speed switching circuit such as, for example, a flip flop circuit. An example of such a high-speed flip-flop circuit is illustrated in FIG. 3. In detail, the high-speed flip-flop circuit is provided with the resonant tunneling hot electron transistor 21 coupled between a source of positive high voltage level Vcc and the ground, and resistors 22 and 23 are provided between the base electrode and an input signal terminal 24 and between the collector electrode and the source of positive high voltage level Vcc, respectively. An output terminal 25 of the flip-flop circuit 21 is provided between the resistor 23 and the resonant tunneling bipolar transistor 21. If an appropriate biasing voltage level is applied to the input terminal 24, the flip-flop circuit is responsive to an input signal S of either positive or negative voltage level with respect to the biasing voltage level and shifted between two stable states due to the base-emitter current-to-voltage characteristics of the negative differential resistance. Thus, the flip-flop circuit is implemented by using the single resonant tunneling hot electron transistor 21.

The flip-flop circuit shown in FIG. 3 is simple in circuit arrangement, however, a problem is encountered in application of the flip-flop circuit to a complex circuit such as, for example, a counter circuit or a shift resistor. In general, it is easy to form a complex circuit with flip-flop circuits each producing not only an output signal but also the complementary output signal thereof. However, the flip-flop circuit shown in FIG. 3 merely produces the single output signal, and, for this reason, the flip-flop circuit shown in FIG. 3 is combined with an inverter circuit for producing the complementary output signal. A difference in phase takes place between the output signal and the complementary output signal due to the switching time period of the inverter circuit, and the interconnection between the flip-flop circuit and the inverter circuit is causative of another time delay. These retard a signal propagation in the complex circuit.

SUMMARY OF THE INVENTION

It is therefore an important object of the present invention to provide a resonant tunneling hot carrier transistor which is desirable for a basic component element used in a complex circuit.

It is another important object of the present invention to provide a resonant tunneling hot electron transistor which produces two output signals complementarily shifted without any substantial time delay.

To accomplish these objects, the present invention proposes to provide two transistors sharing the emitter region and different in resonant energy level from one another to establish two stable state.

In accordance with the present invention, there is provided a resonant tunneling hot carrier transistor fabricated on a substrate formed of a first compound semiconductor material, comprising: a) a first multiple-layer structure provided on the substrate and having a first collector layer of one conductivity type formed of a second compound semiconductor material, a first collector barrier layer of a third compound semiconductor material, a first base layer of the one conductivity type formed of a fourth compound semiconductor material larger in electron affinity than the third compound semiconductor material, and a first quantum well resonator; b) a common emitter layer of the one conductivity type provided on the first multiple-layer structure and formed of a fifth compound semiconductor material; and c) a second multiple-layer structure provided on the common emitter layer and having a second quantum well resonator, a second base layer of the one conductivity type and formed of a sixth compound semiconductor material, a second collector barrier layer formed of a seventh compound semiconductor material smaller in electron affinity than the sixth compound semiconductor material, and a second collector layer of the one conductivity type formed of an eighth compound semiconductor material, wherein first and second sub-bands different in energy level take place in the first and second quantum well resonators, respectively.

BRIEF DESCRIPTION OF THE DRAWINGS

The features and advantages of a resonant tunneling hot carrier transistor according to the present invention will be more clearly understood from the following description taken in conjunction with the accompanying drawings in which.

DESCRIPTION OF THE PREFERRED EMBODIMENTS

First Embodiment

Figure 1:
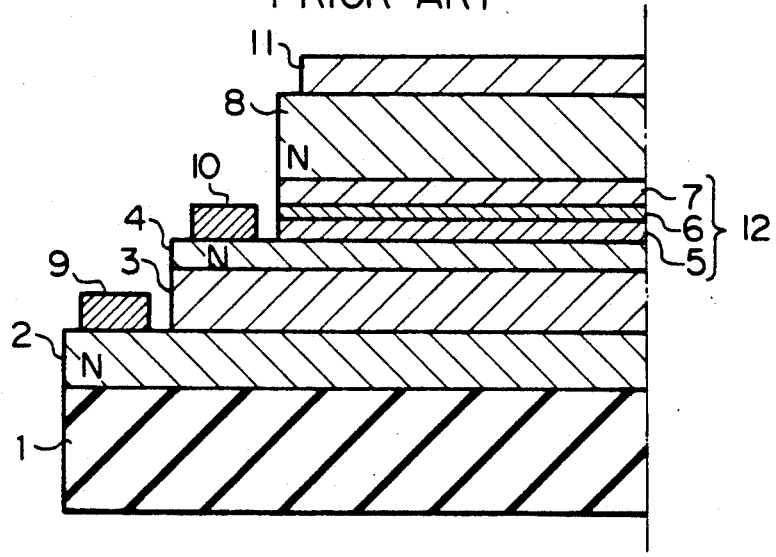
FIG. 1 is a cross sectional view showing the structure of a known resonant tunneling hot electron transistor.
Figure 2:
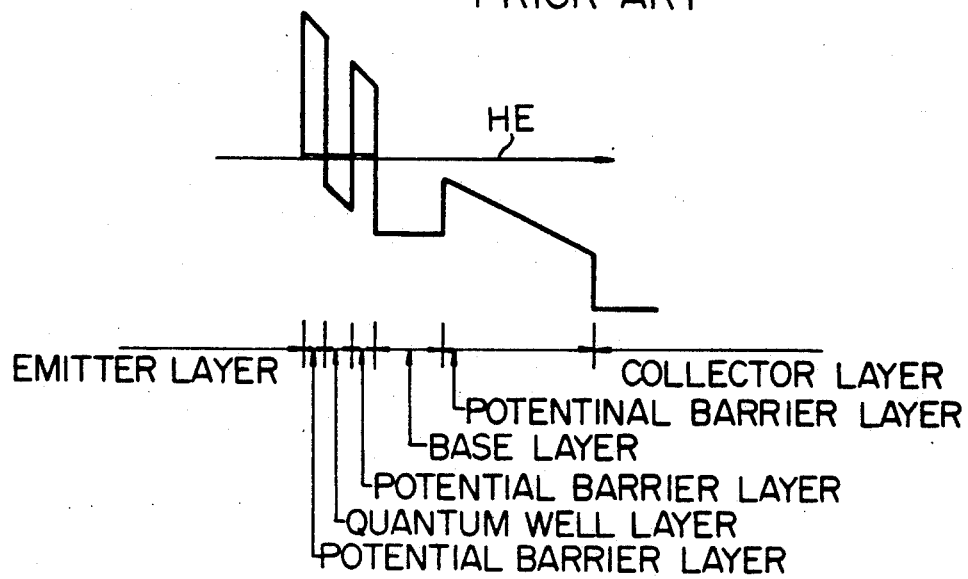
FIG. 2 is an energyband diagram produced in the resonant tunneling hot electron transistor shown in FIG. 1.
Figure 3:
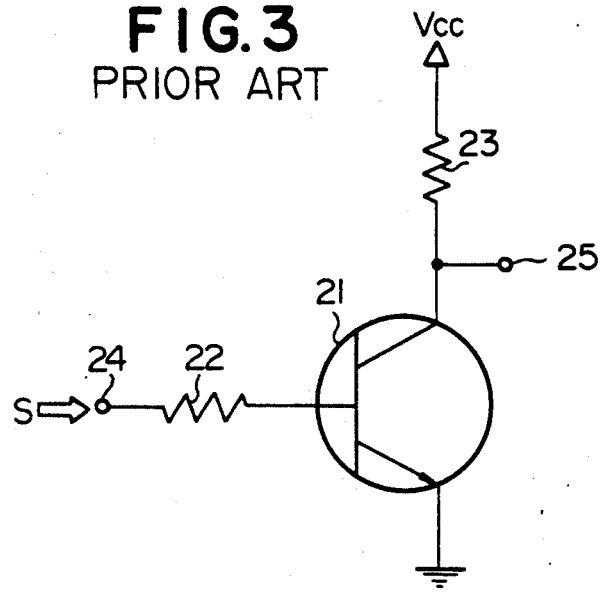
FIG. 3 is a circuit diagram showing the circuit arrangement of a flip-flop circuit implemented by the resonant tunneling hot electron transistor shown in FIG. 1.
Figure 4:
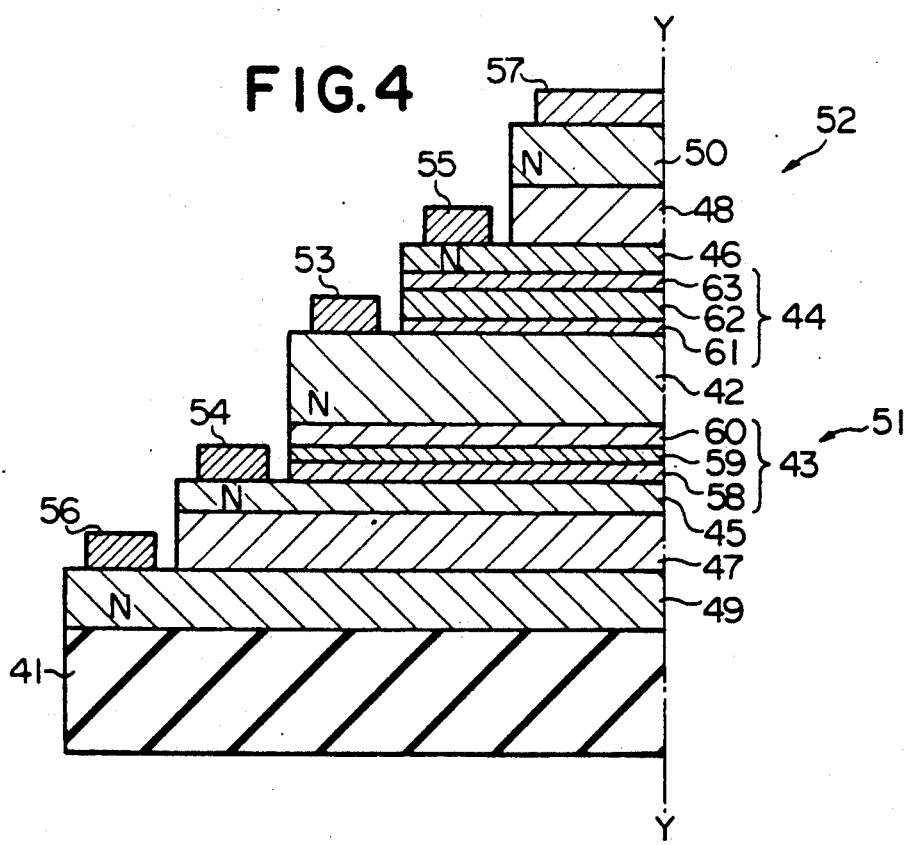
FIG. 4 is a cross sectional view showing the structure of a resonant tunneling hot carrier transistor embodying the present invention.

Referring to FIG. 4, a resonant tunneling hot carrier transistor according to the present invention is fabricated on a semi-insulating substrate 41 formed of a gallium arsenide. FIG. 4 shows the left side of a plane of symmetry Y-Y provided in the structure of the resonant tunneling hot carrier transistor according to the present invention. The resonant tunneling hot carrier transistor largely comprises a common emitter region 42, first and second quantum well resonators 43 and 44, first and second base regions 45 and 46, first and second collector barrier regions 47 and 48, and first and second collector regions 49 and 50. The first quantum well resonator 43, the first base region 45, the first collector barrier region 47 and the first collector region 49 form in combination a first resonant tunneling hot carrier transistor 51 together with the common emitter region 42. In a similar manner, a second resonant tunneling hot carrier transistor 52 is formed by the combination of the common emitter region 42, the second quantum well resonator 44, the second base region 46, the second collector barrier region 48 and the second collector region 50. A common emitter electrode 53 is shared by the first and second resonant tunneling hot carrier transistors 51 and 52 and formed on the common emitter region 42. First and second base electrodes 54 and 55 are formed on the first and second base regions 45 and 46, respectively, and the first and second collector regions 49 and 50 are in contact with first and second collector electrodes 56 and 57, respectively. The first base electrode 54 and the first collector electrode 56 are dedicated for the first resonant hot carrier transistor 51, but the second base electrode 55 and the second collector electrode 57 are provided for the second resonant tunneling hot carrier transistor 52.

For fabrication of the first resonant tunneling hot carrier transistor 51, on the semi-insulating substrate 41 are successively grown an n-type gallium arsenide layer for the first collector region 49 having a thickness of about 1 micron-meter and an impurity concentration of about $1 \times 10^{18}$ atoms/cm$^3$, an intentionally undoped aluminum gallium arsenide layer ($Al_{0.15}Ga_{0.85}As$) for the first collector barrier region 47 having a thickness of about 3000 angstroms, an n-type gallium arsenide layer for the first base region 45 having a thickness of about 1000 angstroms and an impurity concentration of about $1 \times 10^{18}$ atoms/cm$^3$, an intentionally undoped aluminum gallium arsenide layer ($Al_{0.3}Ga_{0.7}As$) for a potential barrier region 58 having a thickness of about 20 angstroms, an intentionally undoped gallium arsenide layer for a quantum well layer 59 having a thickness of about 70 angstroms, an intentionally undoped aluminum gallium arsenide layer ($Al_{0.3}Ga_{0.7}As$) for a potential barrier region 60 having a thickness of about 20 angstroms, and an n-type gallium arsenide layer for the common emitter region 42 having a thickness of about 3500 angstroms and an impurity concentration of about $1 \times 10^{18}$ atoms/cm$^3$. On the common emitter region 42 are further grown an intentionally undoped aluminum gallium arsenide layer (Al$_{0.3}$Ga$_{0.7}$As) for a potential barrier region 61 having a thickness of about 20 angstroms, an intentionally undoped gallium arsenide layer for a quantum well layer 62 having a thickness of about 110 angstroms, an intentionally undoped aluminum gallium arsenide layer (Al$_{0.3}$Ga$_{0.7}$As) for a potential barrier region 63 having a thickness of about 20 angstroms, an n-type gallium arsenide layer for the second base region 46 having a thickness of about 1000 angstroms and an impurity concentration of about $1 \times 10^{18}$ atoms/cm$^3$, an intentionally undoped aluminum gallium arsenide layer (Al$_{0.15}$Ga$_{0.85}$As) for the second collector barrier region 48 having a thickness of about 3000 angstroms, and an n-type gallium arsenide layer for the second collector region 50 having a thickness of about 2000 angstroms and an impurity concentration of about $1 \times 10^{18}$ atoms/cm$^3$ which form the second resonant tunneling hot carrier transistor 52 as described hereinbefore.

Figure 5:
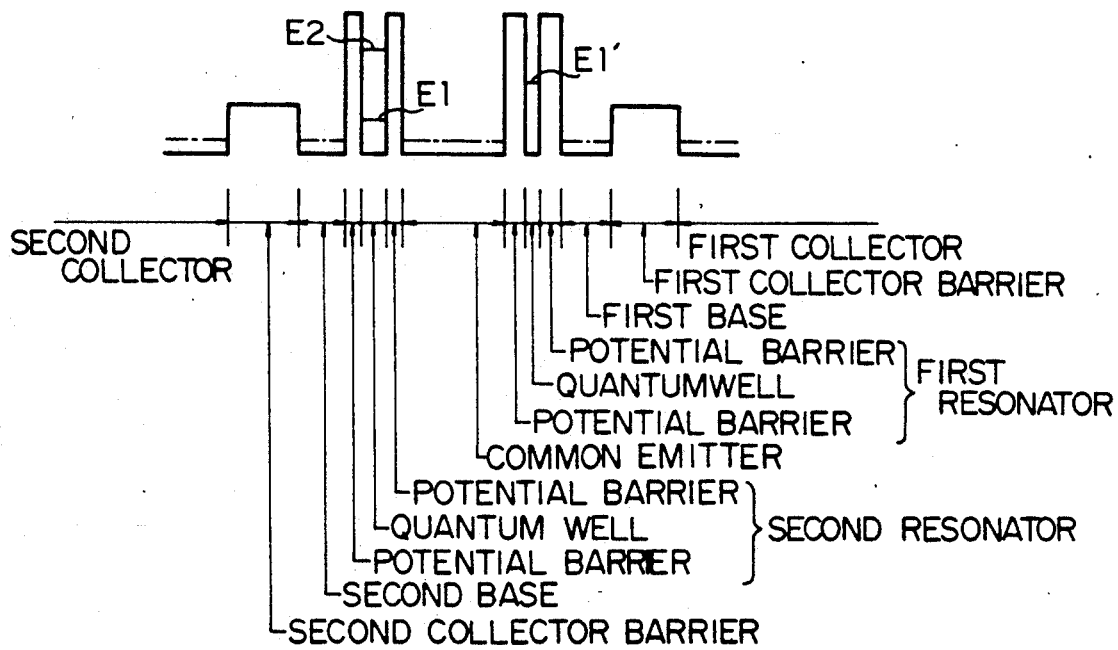
FIG. 5 is an energyband diagram showing the edge profiles of conduction bands produced in the resonant tunneling hot carrier transistor in thermal equilibrium.

The quantum well layer 59 and the potential barrier regions 58 and 60 form in combination the first quantum well resonator 43 with a super-lattice structure, and the quantum well layer 62 and the potential barrier regions 61 and 63 provide the second quantum well resonator 44 with a super-lattice structure. A sub-band takes place in the conduction band of the first quantum well resonators 43, and the bottom energy level of the sub-band is indicated by E1'. The second quantum well resonator 44 also has a sub-band in the conduction band thereof which consists of a plurality of energy levels. The bottom energy level is labeled by E1, and E2 stands for another energy level as illustrated in FIG. 5. Each sub-band consists of a plurality of energy levels En where n is a natural number counted from 1. Each of the energy levels is given by Equation 1

$$En = (h^2/2m)(nPi/L)^2 \qquad \text{Eq. 1}$$

where n is the reduced Planck constant, m is the effective mass of the carrier, Pi is the ratio of the circumference of a circle to its diameter, and L is the width of the quantum well 59 or 62. As will be understood from Equation 1, it is possible to produce various energy levels En by changing the thicknesses of the intentionally undoped gallium arsenide layers for the quantum wells 62 and 59. In this instance, the intentionally undoped gallium arsenide layer for the quantum well 62 is larger in thickness than the intentionally undoped gallium arsenide layer for the quantum well 59, and, accordingly, the energy level E'1 of, for example, about 115 meV is greater than the energy level E1 of, for example, about 50 meV but less than the energy level E2 of, for example, about 180 meV.

Figure 6A:
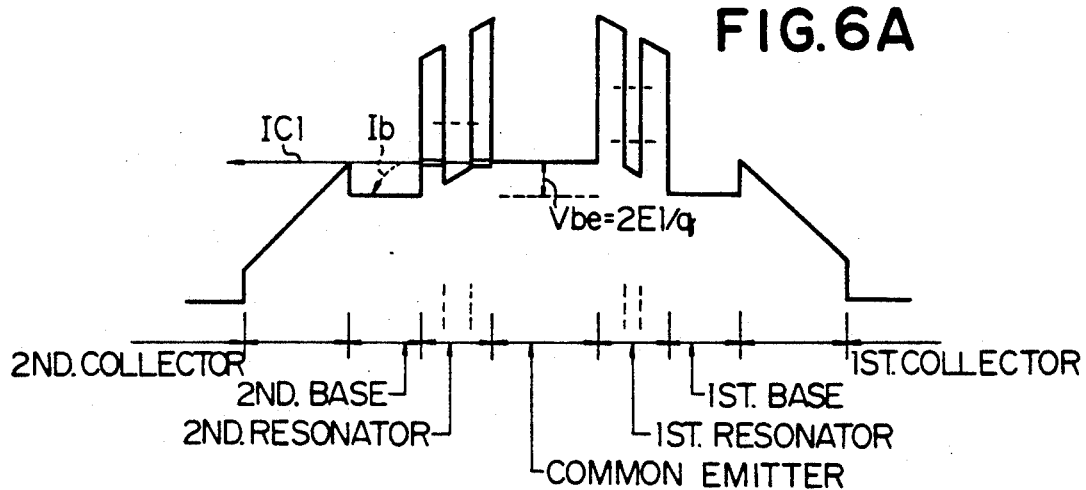
FIGS. 6A to 6C are energyband diagrams showing the edge profiles of the conduction bands produced in the resonant tunneling hot carrier transistor shown in FIG. 4 under different biasing conditions, respectively.
Figure 6B:
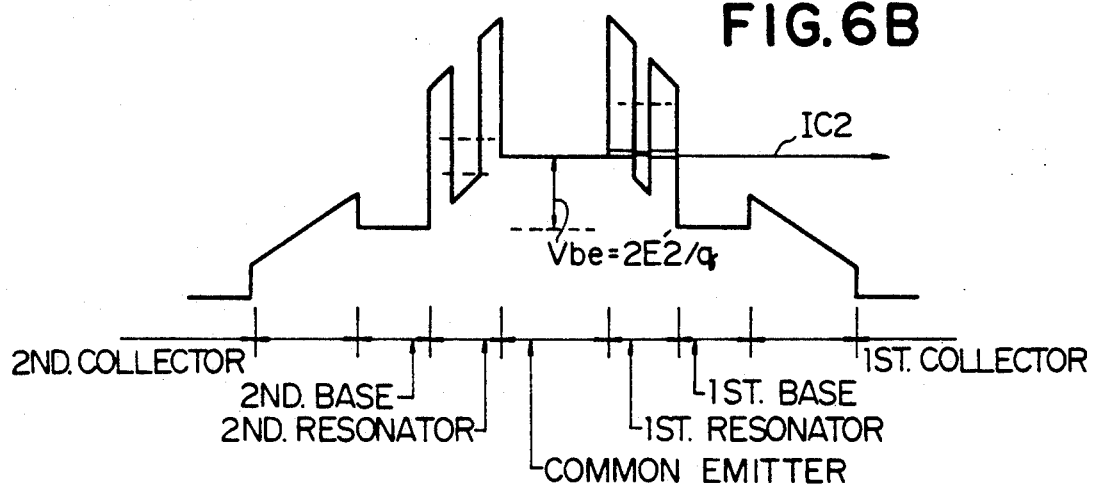
Figure 6C:
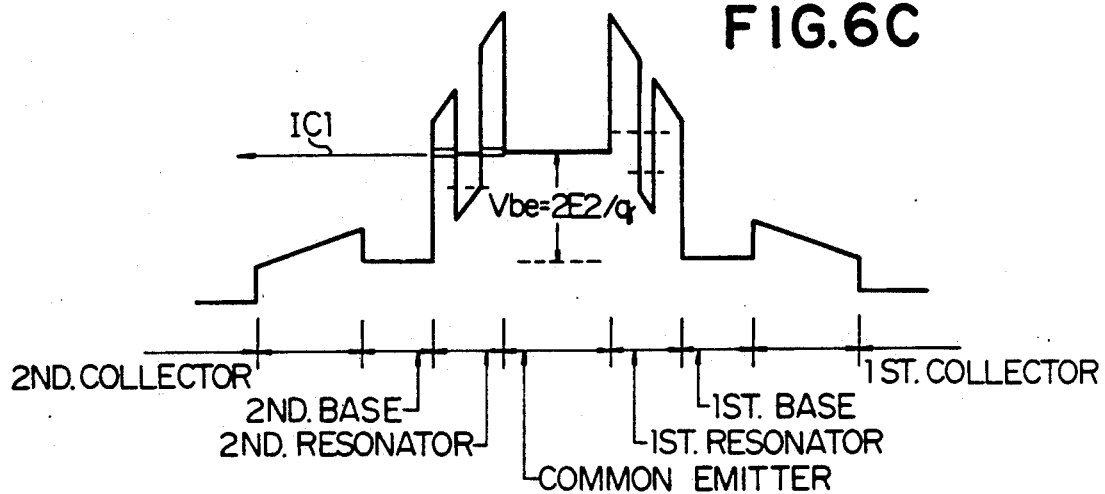

Description will be hereinunder made for the function of the resonant tunneling hot carrier transistor shown in FIG. 4 with reference to FIGS. 6A to 6C on the assumption that the first base electrode 54 is coupled to the second base electrode 55. When the base-emitter voltage Vbe is selected to be about $2 \times E1/q$ where q is the magnitude of electronic charge, electrons are injected into the second base region 46 due to the resonant tunneling phenomenon at the bottom energy level E1 of the second quantum well resonator 44. The injected electrons become hot electrons and travel over the second base region 46 as illustrated in FIG. 6A. The hot electrons reach the second collector region 50, and, accordingly, contribute the collector current Ic1. A part of the hot electrons hardly exceed a potential barrier provided between the second base region 45 and the second collector barrier region 49, because the injected electrons are as high in energy level as the potential barrier. The electrons blocked by the potential barrier participate in the base current Ib. However, no current flows into the first collector region 49, because any resonance does not take place in the first resonator 43.

When the voltage level of $2 \times E'1/q$ is applied between the common emitter electrode 53 and the first and second base electrodes 54 and 55, the resonant tunneling phenomenon takes place at the bottom energy level E'1 of the first quantum well resonator 43, so that electrons are injected from the common emitter region 42 through the bottom energy level E'1 of the first quantum well resonator 43 into the first base region 45 as illustrated in FIG. 6B. The injected electrons become hot electrons traveling over the first base region 45 and, accordingly, participate in the collector current Ic2. However, no base current flows, because most of the injected electrons are much larger in energy level than a potential barrier provided between the first collector barrier region 47 and the first base region 45. For this reason, no base current flows. With the voltage level of $2E'1/q$, no resonance takes place in the second resonator 44, so that any collector current flows in the second collector region 49.

If the base-emitter voltage Vbe is adjusted to a value of $2 \times E2/q$, the resonant tunneling phenomenon takes place at the energy level E2 of the second quantum well resonator 44, so that the collector current Ic1 flows instead of the collector current Ic2 as illustrated in FIG. 6C.

The resonant tunneling hot carrier transistor thus arranged is capable of producing the collector current Ic1 and the base current Ib characterized by negative differential resistance regions at the base-emitter voltage level of $2 \times E1/q$ as well as the collector current Ic2 characterized by another negative differential resistance region at the base-emitter voltage level of $2 \times E'1/q$ by virtue of the dual quantum well resonators 43 and 44. That is, the resonant tunneling hot carrier transistor allows the collector and base currents to indicate the respective negative differential resistance characteristics at the different base-emitter voltage levels, respectively. For this reason, the resonant tunneling hot carrier transistor according to the present invention is desirable for the component bistable element used for an complex circuit.

Figure 7:
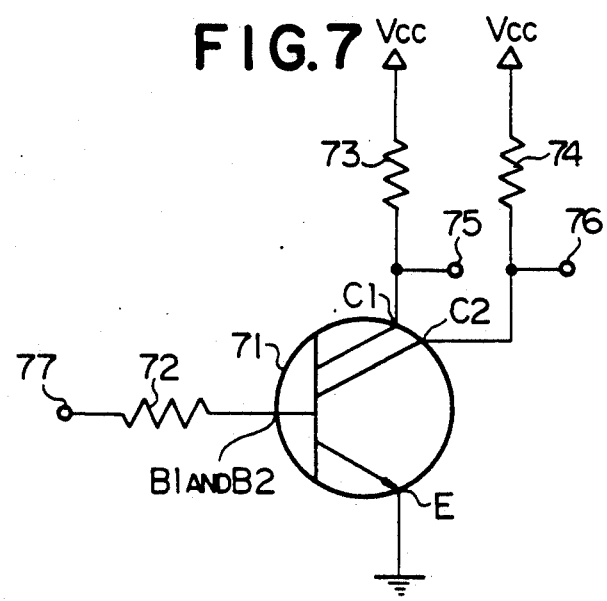
FIG. 7 is a circuit diagram showing the circuit arrangement of a flip-flop circuit implemented by using the resonant tunneling hot carrier transistor shown in FIG. 4.

Turning to FIG. 7 of the drawings, a flip-flop circuit is implemented by the resonant tunneling hot carrier transistor illustrated in FIG. 4. The flip-flop circuit is provided with the single resonant tunneling hot carrier transistor 71 and three resistors 72, 73 and 74, and the resonant tunneling hot carrier transistor 71 has two base electrodes B1 and B2 coupled to one another, a grounded common emitter electrode E and two collector electrodes C1 and C2 coupled in parallel to a source of positive voltage level Vcc through the resistors 73 and 74, respectively. The base electrodes B1 and B2 are coupled through the resistor 72 to an input node 77, and two output nodes 75 and 76 are provided between the two collector electrodes C1 and C2 and the resistors 73 and 74, respectively.

Figure 8:
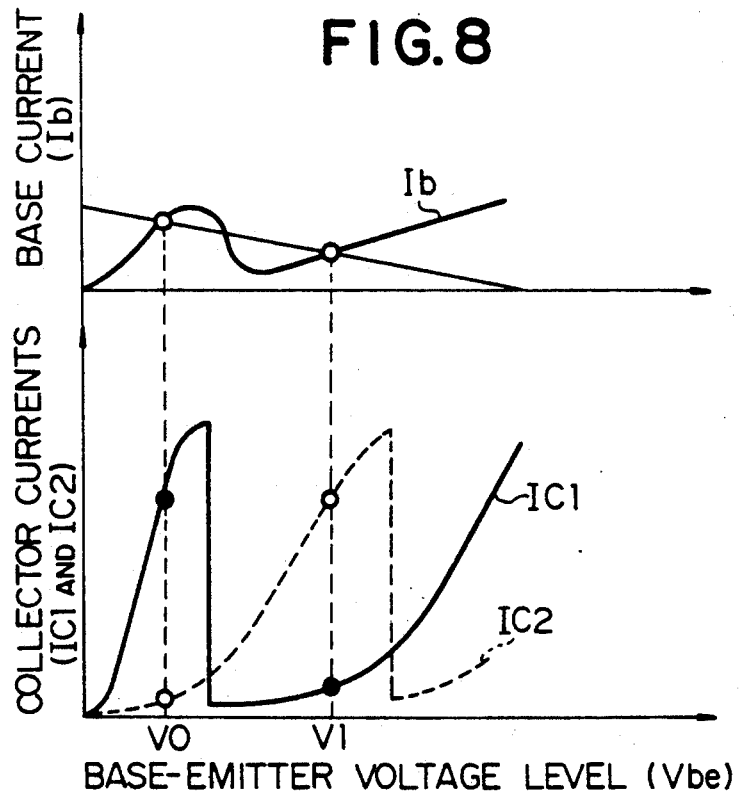
FIG. 8 is a graph showing the collector currents and the base current in terms of the base-emitter voltage level applied to the resonant tunneling hot electron transistor forming part of the flip-flop circuit shown in FIG. 7.

The circuit behavior of the flip-flop circuit thus arranged is derived from FIG. 8. In FIG. 8, plots Ib indicate the base current in terms of the base-emitter voltage level Vbe which has a negative differential resistance region. Plots Ic1 and Ic2 respectively represent the collector currents due to the electron injections produced at different base-emitter voltage levels V0 and V1, respectively. The base-emitter voltage levels V0 and V1 are respectively adjusted to $2 \times E1/q$ and $2 \times E'1/q$ by selection of the resistance provided with the resistor 72. That is, with the relatively low voltage level V0 applied between the base nodes and the emitter node, the collector current Ic1 is rapidly increased due to the resonant tunneling phenomenon, and, accordingly, produces an output signal of a low voltage level at the output node 75, however, negligible amount of collector current Ic2 merely flows into the collector node C2 and, for this reason, the output node 76 remains in a high voltage level. On the other hand, if the base-emitter voltage level Vbe is adjusted to the relatively high voltage level V1, the collector current Ic2 is rapidly increased due to the resonant tunneling phenomenon to produce the low voltage level at the output node 76, however, the high voltage level appears at the output node 75. Thus, the flip-flop circuit has two stable states depending upon the base-emitter voltage level Vbe, and no time delay takes place between the alternation of the output voltage levels, because the two stable states are based on the two different negative differential resistance regions.

When a positive pulse signal with respect to the base emitter voltage level of V0 is applied to the input node 77, the output nodes 75 and 76 are complementarily inverted in voltage level, however, if a negative pulse is applied to the input node 77 under the same base-emitter biasing condition, the output signal and the complementary signal keep the previous voltage levels, respectively. Moreover, the output nodes 75 and 76 are shifted to the respective voltage levels at the base-emitter voltage level of V0 with a negative pulse signal with respect to the base-emitter biasing voltage level of V1. Table 1 is the truth table of the flip-flop circuit where S0 and R0 represent the positive input signal and the negative input signal, respectively.

TABLE 1

| S0 | R0 | Output signal | Complementary signal |
|----|----|---------------|----------------------|
| 0  | 0  | Unchanged     | Unchanged            |
| 1  | 0  | High voltage level | Low voltage level |
| 0  | 1  | Low voltage level | High voltage level |
| 1  | 1  | Undefined     | Undefined            |

Figure 9:
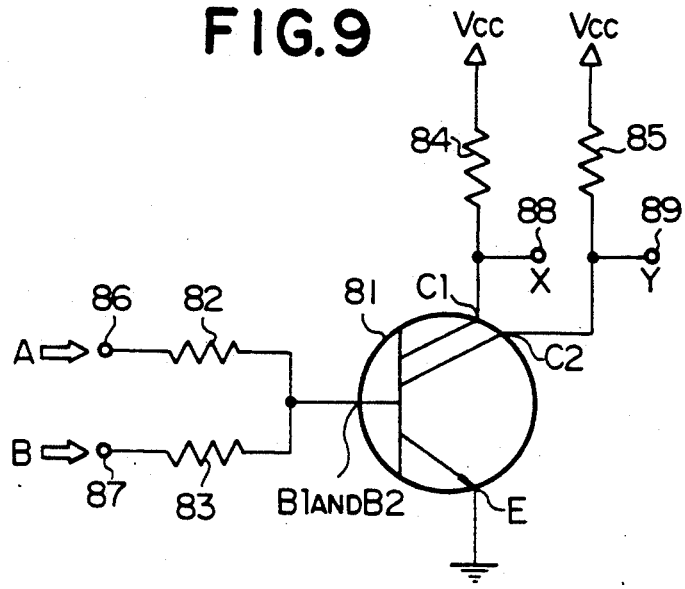
FIG. 9 is a circuit diagram showing the circuit arrangement of a logic gate implemented by using the resonant tunneling hot electron transistor shown in FIG. 4.
Figure 10:
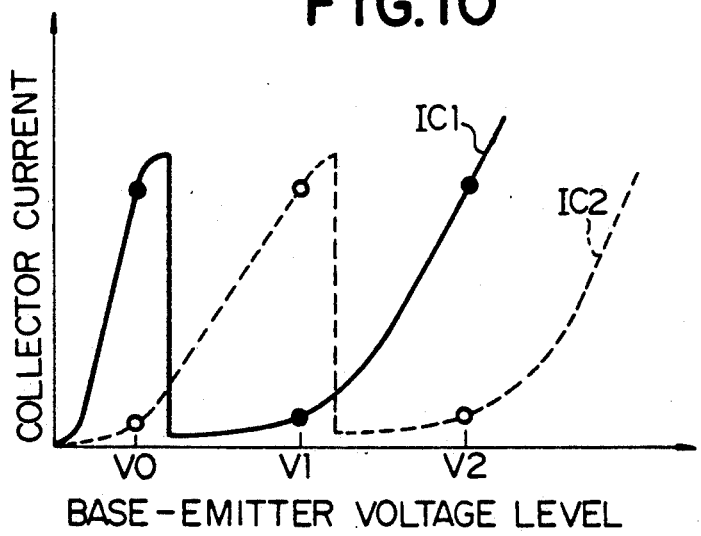
FIG. 10 is a graph showing the collector currents in terms of the base-emitter voltage level applied to the resonant tunneling hot carrier transistor forming part of the logic gate shown in FIG. 9.

The resonant tunneling hot carrier transistor is applicable to a logic gate. Turning to FIG. 9 of the drawings, a logic gate comprises a resonant tunneling hot carrier transistor 81 according to the present invention and four resistors 82, 83, 84 and 85. The resonant tunneling hot carrier transistor 81 has two base nodes B1 and B2 coupled to one another, a grounded common emitter node E and two collector nodes C1 and C2 coupled in parallel to the source of positive voltage level Vcc through the resistors 84 and 85, respectively. The resistors 82 and 83 are respectively coupled to input nodes 86 and 87, and the logic gate has two output nodes 88 and 89 between the two collector electrodes C1 and C2 and the resistors 84 and 85, respectively. If the resistors 82 and 83 are appropriately selected, two stable states in the base current corresponding to these shown in FIG. 8 are eliminated from the resonant tunneling hot electron transistor 81. If the base-emitter voltage levels are shifted amond three values $V0=2E1/q$, $V1=2E'1/q$ and $V2=2E2/q$ on the assumption that logic "0" and "1" levels are selected to be V0/2 and V1−V0/2, respectively, two input signals A and B both logic "0" level produce the base-emitter voltage level of nearly V0, and, on the other hand, the two input signals A and B both logic "1" level yield the base-emitter voltage level of nearly V2. These base-emitter voltage levels respectively allow the first and second resonant hot electron transistors to turn on to produce the collector currents Ic2 and Ic1 as will be seen from FIG. 10. However, if one of the input signals is logic "0" level and the other is logic "1", the base-emitter voltage level has the value of V1 and, accordingly, only the first resonant tunneling hot electron transistor turns on to produce the collector current Ic1. The switching actions of these transistors result in the exclusive OR function at the node 88 and the exclusive NOR function at the node 89 which are summarized in Table 2. In Table 2, X and Y stand for the output signals at the nodes 88 and 89, respectively.

TABLE 2

| Input signal A | Input signal B | Output signal X | Output signal Y |
|----------------|----------------|-----------------|-----------------|
| 0 | 0 | 0 | 1 |
| 1 | 0 | 1 | 0 |
| 0 | 1 | 1 | 0 |
| 1 | 1 | 0 | 1 |

Second Embodiment

Figure 11:
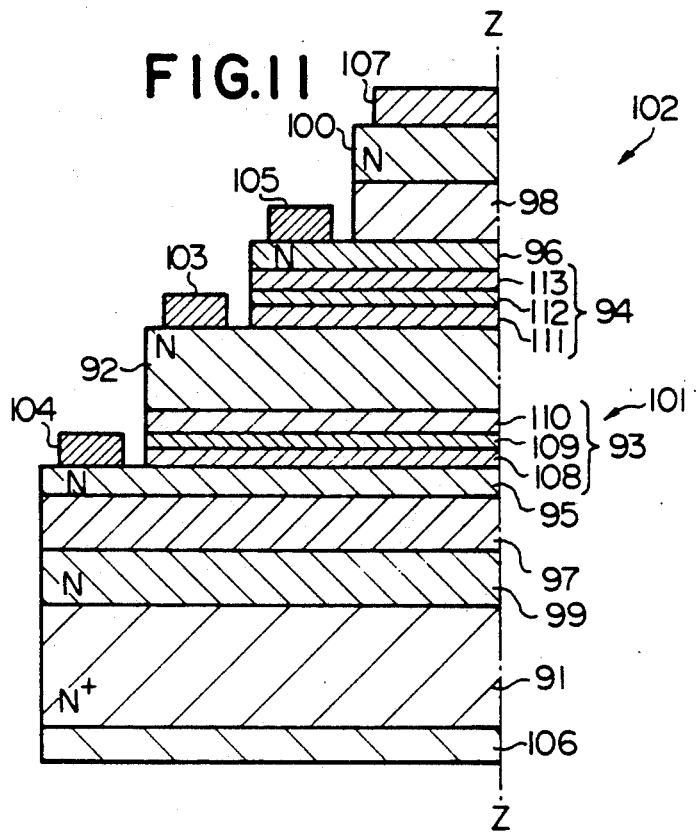
FIG. 11 is a cross sectional view showing the structure of another resonant tunneling hot electron transistor embodying the present invention.

Turning to FIG. 11, another resonant tunneling hot carrier transistor according to the present invention is fabricated on a substrate 91 formed of a heavily-doped n-type gallium arsenide. FIG. 11 shows the left side of a plane of symmetry Z-Z provided in the structure of the resonant tunneling hot carrier transistor as similar to FIG. 4. The resonant tunneling hot carrier transistor largely comprises a common emitter region 92, first and second quantum well resonators 93 and 94, first and second base regions 95 and 96, first and second collector barrier regions 97 and 98, and first and second collector regions 99 and 100. The first quantum well resonator 93, the first base region 95 the first collector barrier region 97 and the first collector region 99 form in combination a first resonant tunneling hot carrier transistor 101 together with the common emitter region 92. In a similar manner, a second resonant tunneling hot carrier transistor 102 is formed by the combination of the common emitter region 92, the second quantum well resonator 94, the second base region 96, the second collector barrier region 98 and the second collector region 100. A common emitter electrode 103 is shared by the first and second resonant tunneling hot carrier transistors 101 and 102 and formed on the common emitter region 92. First and second base electrodes 104 and 105 are formed on the first and second base regions 95 and 96, respectively, and the substrate 91 and the collector region 100 are in contact with first and second collector electrodes 106 and 107, respectively. The first base electrode 104 and the first collector electrode 106 are dedicated for the first resonant hot carrier transistor 101, but the second base electrode 105 and the second collector electrode 107 are provided for the second resonant tunneling hot carrier transistor 102.

For fabrication of the second resonant tunneling hot carrier transistor 101, on the substrate 91 are successively grown an n-type gallium arsenide layer for the first collector region 99 having a thickness of about 4000 angstroms and an impurity concentration of about $2 \times 10^{18}$ atoms/cm$^3$, an unintentionally undoped aluminum gallium arsenide layer (Al$_{0.2}$Ga$_{0.8}$As) for the first collector barrier layer 97 having a thickness of about 2000 angstroms, an n-type gallium arsenide layer for the first base region 95 having a thickness of about 500 angstroms and an impurity concentration of about $1 \times 10^{18}$ atoms cm$^3$, an intentionally undoped aluminum arsenide layer for a potential barrier region 108 having a thickness of about 30 angstroms, an intentionally undoped gallium arsenide layer for a quantum well 109 having a thickness of about 70 angstroms, an intentionally undoped aluminum arsenide layer for a potential barrier region 110 having a thickness of about 30 angstroms, and an n-type gallium arsenide layer for the common emitter region 92 having a thickness of about 4000 angstroms and an impurity concentration of about $3 \times 10^{18}$ atoms/cm$^3$. On the common emitter region 92 are further grown an intentionally undoped aluminum arsenide layer for a potential barrier region 111 having a thickness of about 30 angstroms, an intentionally undoped indium gallium arsenide layer (In$_{0.1}$Ga$_{0.9}$As) for a quantum well 112 having a thickness of about 70 angstroms, an intentionally undoped aluminum arsenide layer for a potential barrier region 113 having a thickness of about 30 angstroms, an n-type gallium arsenide layer for the second base region 96 having a thickness of about 500 angstroms and an impurity concentration of about $1 \times 10^{18}$ atoms/cm$^3$, an intentionally undoped aluminum gallium arsenide layer (Al$_{0.2}$Ga$_{0.8}$As) for the second collector barrier region 98 having a thickness of about 2000 angstroms, and an n-type gallium arsenide layer for the second collector region 100 having a thickness of about 4000 angstroms and an impurity concentration of about $2 \times 10^{18}$ atoms/cm$^3$ which form the second resonant tunneling hot carrier transistor 102 as described hereinbefore.

Figure 12:
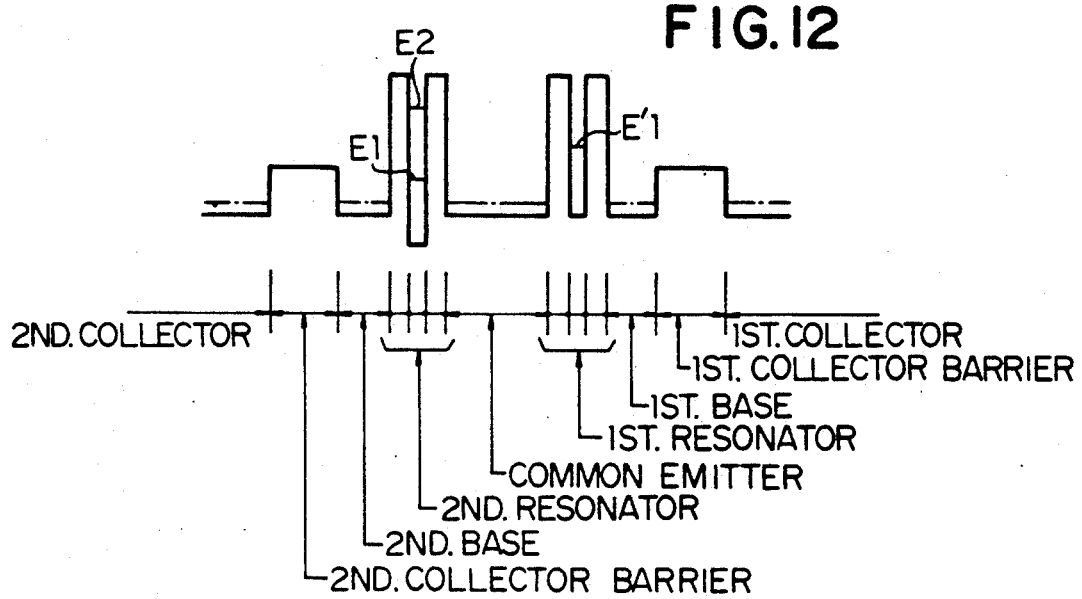
FIG. 12 is an energyband diagram showing the edge profiles of the conduction bands produced in the resonant tunneling hot carrier transistor shown in FIG. 11 in thermal equilibrium.

Each of the quantum well resonators 93 and 94 has a super-lattice structure, and sub-bands take place in the resonator 93 and 94, respectively. Discrete energy levels En and E'n (where n is a natural number counted from "1") are produced in the quantum well layers 109 and 112 for electrons as illustrated in FIG. 12, and E1 and E'1 stand for the bottom energy levels produced in the quantum well layers 109 and 112, respectively. The energy levels are also calculated by Equation 1, and, for this reason, no further description is incorporated.

In the first quantum well resonator 94, aluminum arsenide is different in lattice constant from indium gallium arsenide, and, for this reason, mis-fit dislocations are liable to take place therebetween. However, if the indium gallium arsenide layer is smaller in thickness than about 500 angstroms, the indium gallium arsenide layer is formed as a strain lattice layer and, accordingly, an elastic strain absorbs the lattice-mismatch produced therebetween. In this instance, the indium gallium arsenide layer for the quantum well region 112 is about 70 angstroms thick, so that an acceptable boundary is produced therebetween.

Since the indium gallium arsenide In$_{0.1}$Ga$_{0.9}$As is smaller in bandgap than gallium arsenide, the bottom of the conduction band for the quantum well layer 112 is offset from those for the common emitter region 92 and the second base region 96 by about 90 meV due to the difference in the bandgap. As a result, the energy level E'1 of, for example, about 115 meV is greater than the energy level E1 of, for example, about 30 meV but less than the energy level E2 of, for example, 370 meV even if the quantum wells 108 and 111 are equal in thickness to one another.

In the embodiments described hereinbefore as well as claims, the words "intentionally undoped" are indicative of a concentration range not greater than about $1 \times 10^{16}$/cm$^3$.

Although particular embodiments of the present invention have been shown and described, it will be obvious to those skilled in the art that various changes and modifications may be made without departing from the spirit and scope of the present invention. For example, the above mentioned embodiments are formed of the compound semiconductor materials of the gallium arsenide-and-aluminum gallium arsenide system, however, another compound semiconductor system is available for fabrication of the resonant tunneling hot carrier transistor in accordance with the present invention. Moreover, various logic gates may be implemented by the resonant tunneling hot carrier transistor according to the present invention. The base, emitter and collector regions are formed of the n-type compound semiconductor, however, p-type semiconductor materials are available for fabrication of a resonant tunneling hot carrier transistor according to the present invention.

What is claimed is:

1. A resonant tunneling hot carrier transistor fabricated on a substrate formed of a first compound semiconductor material, comprising:
   a) a first n-type collector layer provided on said substrate and formed of a second compound semiconductor material;
   b) a first collector barrier layer formed on said first n-type collector layer and of a third compound semiconductor material;
   c) a first n-type base layer formed on said first collector barrier layer and of a fourth compound semiconductor material;
   d) a first quantum well resonator formed on said first n-type base layer and having a first quantum well layer of a fifth compound semiconductor material sandwiched between first and second potential barrier layers of a sixth compound semiconductor material;
   e) a common n-type emitter layer formed on said quantum well resonator and of a seventh compound semiconductor material;
   f) a second quantum well resonator formed on said common n-type emitter layer and having a second quantum well layer of an eighth compound semiconductor material sandwiched between third and fourth potential barrier layers of a ninth compound semiconductor material;
   g) a second n-type base layer formed on said second quantum well resonator and of a tenth compound semiconductor material;
   h) a second collector barrier layer formed on said second n-type base layer and of an eleventh compound semiconductor material; and
   i) a second n-type collector layer formed on said second collector barrier layer and of a twelfth compound semiconductor material, wherein said first and second quantum well layers are different in thickness from one another.

2. A resonant tunneling hot carrier transistor as set forth in claim 1, in which said fifth and sixth compound semiconductor materials are intentionally undoped gallium arsenide and intentionally undoped Al$_x$Ga$_{1-x}$As, respectively, wherein x is greater than zero and is equal to or less than unity.

3. A resonant tunneling hot carrier transistor as set forth in claim 2, in which said eighth and ninth compound semiconductor materials are intentionally undoped gallium arsenide and intentionally undoped $Al_xGs_{1-x}As$, respectively, wherein x is greater than zero and is equal to or less than unity.

4. A resonant tunneling hot carrier transistor as set forth in claim 3, in which said substrate is formed of gallium arsenide.

5. A resonant tunneling hot carrier transistor as set forth in claim 1, in which said first and second n-type base layers are coupled to one another for providing an input node, said common n-type emitter layer being coupled to a constant voltage source, said first and second n-type collector layers providing first and second output nodes.

6. A resonant tunneling hot carrier transistor fabricated on a substrate formed of a first compound semiconductor material, comprising:

a) a first n-type collector layer provided on said substrate and formed of a second compound semiconductor material;

b) a first collector barrier layer formed on said first n-type collector layer and of a third compound semiconductor material;

c) a first n-type base layer formed on said first collector barrier layer and of a fourth compound semiconductor material;

d) a first quantum well resonator formed on said first n-type base layer and having a first quantum well layer of a fifth compound semiconductor material sandwiched between first and second potential barrier layers of an sixth compound semiconductor material;

e) a common n-type emitter layer formed on said first quantum well resonator and of a seventh compound semiconductor material;

f) a second quantum well resonator formed on said common n-type emitter layer and having a second quantum well layer of a eighth compound semiconductor material sandwiched between third and fourth potential barrier layers of a ninth compound semiconductor material;

g) a second n-type base layer formed on said second quantum well resonator and of a tenth compound semiconductor material;

h) a second collector barrier layer formed on said second n-type base layer and of a eleventh compound semiconductor material and i) a second n-type collector layer formed on said second collector barrier layer and of a twelfth compound semiconductor material, wherein said fifth and eighth compound semiconductor materials are different in electron affinity from one another.

7. A resonant tunneling hot carrier transistor as set forth in claim 6, in which said fifth and sixth compound semiconductor materials are intentionally undoped gallium arsenide and intentionally undoped $Al_xGa_{1-x}As$, respectively, wherein x is greater than zero and is equal to or less than unity.

8. A resonant tunneling hot carrier transistor as set forth in claim 7, in which said eighth and ninth compound semiconductor materials are intentionally undoped indium gallium arsenide and intentionally undoped $Al_xGa_{1-x}As$, respectively, wherein x is greater than zero and is equal to or less than unity.

9. A resonant tunneling hot carrier transistor as set forth in claim 8, in which said first and second quantum well layers are approximately equal in thickness to one another.

10. A resonant tunneling hot carrier transistor as set forth in claim 8, in which said indium gallium arsenide is represented by the molecular formula of $In_{0.1}Ga_{0.9}As$.

11. A resonant tunneling hot carrier transistor as set forth in claim 8, in which said substrate is formed of gallium arsenide.

12. A resonant tunneling hot carrier transistor as set forth in claim 6, in which said first and second n-type base layers are coupled to one another for providing an input node, said common n-type emitter layer being coupled to a constant voltage source, said first and second n-type collector layers providing first and second output nodes.

* * * * *